US006228434B1

(12) United States Patent
Affinito

(10) Patent No.: US 6,228,434 B1
(45) Date of Patent: *May 8, 2001

(54) METHOD OF MAKING A CONFORMAL COATING OF A MICROTEXTURED SURFACE

(75) Inventor: John D. Affinito, Kennewick, WA (US)

(73) Assignee: Battelle Memorial Institute, Richland, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/212,780

(22) Filed: Dec. 16, 1998

(51) Int. Cl.[7] .................... C23C 14/32

(52) U.S. Cl. .................... 427/488; 427/509; 427/562; 427/398.1; 427/255.6

(58) Field of Search .................... 427/255.6, 492, 427/488, 497, 509, 562, 398.1

(56) References Cited

U.S. PATENT DOCUMENTS 3,475,307 10/1969 Knox et al. .
3,607,365 9/1971 Lindlof .
4,098,965 7/1978 Kinsman .
4,283,482 8/1981 Hattori et al. .
4,581,337 4/1986 Frey et al. .

(List continued on next page.)

FOREIGN PATENT DOCUMENTS 704 297 2/1968 (BE) .
196 03 746 4/1997 (DE) .
0 340 935 11/1989 (EP) .
0 390 540 10/1990 (EP) .
0 299 753 1/1993 (EP) .

(List continued on next page.)

OTHER PUBLICATIONS

Affinito, J.D. et al., "PML/oxide/PML barrier layer performance differences arising from use of UV or electron beam polymerization of the PML layers" Thin Solid Films, Elsevier Science S.A., vol. 308–309, Oct. 31, 1997, pp. 19–25.

Affinito, J.D. et al., "High rate vacuum deposition of polymer electrolytes" Journal Vacuum Science Technology A 14(3), May/Jun. 1996, pp. 733–738.

Penning, F.M., "Electrical Discharges in Gases" Gordon and Breach, Science Publishers, 1965, Chapters 5–6, pp. 19–35, and Chapter 8, pp. 41–50.

Affinito, J.D. et al., "Vacuum Deposition of Polymer Electrolytes On Flexible Substrates" Proceedings of the Ninth International Conference on Vacuum Web Coating, Nov. 1995, ed R. Bakish, Bakish Press 1995, pp. 20–36.

Inoue et al., Proc. Jpn. Congr. Mater. Res., vol. 33, pp. 177–179, 1990.

(List continued on next page.)

*Primary Examiner*—Shrive Beck
*Assistant Examiner*—Bret Chen
(74) *Attorney, Agent, or Firm*—Killworth, Gottman, Hagan & Schaeff, L.L.P.

(57) ABSTRACT

The method of the present invention for conformally coating a microtextured surface has the steps of (a) flash evaporating a coating material monomer in an evaporate outlet forming an evaporate; (b) passing the evaporate to a glow discharge electrode creating a glow discharge monomer plasma from the evaporate; and (c) cryocondensing the glow discharge monomer plasma on the microtextured surface and crosslinking the glow discharge monomer plasma thereon, wherein the crosslinking results from radicals created in the glow discharge monomer plasma and achieves self curing.

15 Claims, 3 Drawing Sheets

U.S. PATENT DOCUMENTS

| | | | | |
|---|---|---|---|---|
| 4,624,867 | | 11/1986 | Iijima et al. . | |
| 4,695,618 | | 9/1987 | Mowrer . | |
| 4,842,893 | * | 6/1989 | Yializis et al. . | |
| 4,954,371 | | 9/1990 | Yializis . | |
| 5,032,461 | * | 7/1991 | Shaw et al. | 428/461 |
| 5,237,439 | | 8/1993 | Misono et al. . | |
| 5,260,095 | * | 11/1993 | Affinito | 427/124 |
| 5,354,497 | | 10/1994 | Fukuchi et al. . | |
| 5,395,644 | * | 3/1995 | Affinito | 427/124 |
| 5,427,638 | | 6/1995 | Goetz et al. . | |
| 5,440,446 | | 8/1995 | Shaw et al. . | |
| 5,536,323 | | 7/1996 | Kirlin et al. . | |
| 5,547,508 | | 8/1996 | Affinito . | |
| 5,554,220 | | 9/1996 | Forrest et al. . | |
| 5,576,101 | | 11/1996 | Saitoh et al. . | |
| 5,607,789 | | 3/1997 | Treger et al. . | |
| 5,620,524 | | 4/1997 | Fan et al. . | |
| 5,629,389 | | 5/1997 | Roitman et al. . | |
| 5,654,084 | | 8/1997 | Egert . | |
| 5,681,615 | * | 10/1997 | Affinito et al. | 427/255.6 |
| 5,681,666 | | 10/1997 | Treger et al. . | |
| 5,684,084 | | 11/1997 | Lewin et al. . | |
| 5,686,360 | | 11/1997 | Harvey, III et al. . | |
| 5,693,956 | | 12/1997 | Shi et al. . | |
| 5,711,816 | | 1/1998 | Kirlin et al. . | |
| 5,725,909 | * | 3/1998 | Shaw et al. | 427/412.1 |
| 5,731,661 | | 3/1998 | So et al. . | |
| 5,747,182 | | 5/1998 | Friend et al. . | |
| 5,757,126 | | 5/1998 | Harvey, III et al. . | |
| 5,759,329 | | 6/1998 | Krause et al. . | |
| 5,792,550 | | 8/1998 | Phillips et al. . | |
| 5,811,177 | | 9/1998 | Shi et al. . | |
| 5,811,183 | | 9/1998 | Shaw et al. . | |
| 5,821,692 | | 10/1998 | Rogers et al. . | |
| 5,844,363 | | 12/1998 | Gu et al. . | |
| 5,872,355 | | 2/1999 | Hueschen . | |
| 5,902,641 | * | 5/1999 | Affinito et al. | 427/255.32 |
| 5,902,688 | | 5/1999 | Antoniadis et al. . | |
| 5,904,958 | | 5/1999 | Dick et al. . | |
| 5,912,069 | | 6/1999 | Yializis et al. . | |
| 5,922,161 | | 7/1999 | Wu et al. . | |
| 5,945,174 | | 8/1999 | Shaw et al. . | |
| 5,948,552 | | 9/1999 | Antoniadis et al. . | |
| 5,965,907 | | 10/1999 | Huang et al. . | |
| 5,996,498 | * | 12/1999 | Lewis . | |
| 6,045,864 | | 4/2000 | Lyons et al. . | |
| 6,083,628 | | 7/2000 | Yializis . | |

FOREIGN PATENT DOCUMENTS

| | | |
|---|---|---|
| 0 547 550 | 6/1993 | (EP) . |
| 0 590 467 | 4/1994 | (EP) . |
| 0 722 787 | 7/1996 | (EP) . |
| 0 787 826 | 8/1997 | (EP) . |
| 0 916 394 | 5/1999 | (EP) . |
| 0 931 850 | 7/1999 | (EP) . |
| 0 977 469 | 2/2000 | (EP) . |
| 63-136316 | 6/1988 | (JP) . |
| 64-18441 | 1/1989 | (JP) . |
| 2-183230 | 7/1990 | (JP) . |
| 08325713 | 12/1996 | (JP) . |
| 09059763 | 3/1997 | (JP) . |
| WO 87/07848 | 12/1987 | (WO) . |
| WO 95/10117 | 4/1995 | (WO) . |
| WO 97/04885 | 2/1997 | (WO) . |
| WO 97/22631 | 6/1997 | (WO) . |
| WO 98/10116 | 3/1998 | (WO) . |
| WO 98/18852 | 5/1998 | (WO) . |
| WO 99/16557 | 4/1999 | (WO) . |
| WO 99/16931 | 4/1999 | (WO) . |

OTHER PUBLICATIONS

Vossen, J.L. et al. editors, "Thin Film Processes" Academic Press, 1978, Part II, Chapter II–1, "Glow Discharge Sputter Deposition", pp. 12–63;Part IV, Chapter IV–1, "Plasma Deposition of Inorganic Thin Films", pp. 335–360 and Chapter IV–2 "Glow Discharge Polymerization", pp.361–397.

International Search Report for PCT/US99/30072 May 9, 2000.

G Gustafson, Y. Cao, G.M. Treacy, F. Klavetter, N. Colaneri, and A.J. Heeger, "Flexible light–emitting diodes made from soluble conducting polymers." Nature, vol 35, Jun. 11, 1992, pp. 477–479.

J.D. Affinito, M.E. Gross, C.A. Coronado, G.L. Graff, E.N. Greenwell, and P.M. Martin, *Polymer–Oxide Transparent Barrier Layers Produced Using the PML Process,* 39$^{th}$ Annual Technical Conference Proceedings of the Society of Vacuum Coaters, Vacuum Web Coating Session, 1996, pp. 392–397.

J.D. Affinito, Stephan, Eufinger, M.E. Gross, G.L. Graff, and P.M. Martin, *PML/Oxide/PML Barrier Layer Performance Differences Arising From Use of UV or Electron Beam Polymerization of the PML Layers,* Thin Solid Films, vol. 308, 1997, pp. 19–25.

* cited by examiner

METHOD OF MAKING A CONFORMAL COATING OF A MICROTEXTURED SURFACE

FIELD OF THE INVENTION

The present invention relates generally to a method of making plasma polymerized polymer films. More specifically, the present invention relates to making a plasma polymerized polymer film onto a microtextured surface via plasma enhanced chemical deposition with a flash evaporated feed source of a low vapor pressure compound.

As used herein, the term "(meth)acrylic" is defined as "acrylic or methacrylic". Also, "(meth)acrylate" is defined as "acrylate or methacrylate".

As used herein, the term "cryocondense" and forms thereof refers to the physical phenomenon of a phase change from a gas phase to a liquid phase upon the gas contacting a surface having a temperature lower than a dew point of the gas.

BACKGROUND OF THE INVENTION

The basic process of plasma enhanced chemical vapor deposition (PECVD) is described in THIN FILM PROCESSES, J. L. Vossen, W. Kern, editors, Academic Press, 1978, Part IV, Chapter IV-1 Plasma Deposition of Inorganic Compounds, Chapter IV-2 Glow Discharge Polymerization, herein incorporated by reference. Briefly, a glow discharge plasma is generated on an electrode that may be smooth or have pointed projections. Traditionally, a gas inlet introduces high vapor pressure monomeric gases into the plasma region wherein radicals are formed so that upon subsequent collisions with the substrate, some of the radicals in the monomers chemically bond or cross link (cure) on the substrate. The high vapor pressure monomeric gases include gases of $CH_4$, $SiH_4$, $C_2H_6$, $C_2H_2$, or gases generated from high vapor pressure liquid, for example styrene (10 torr at 87.4 EF (30.8 EC)), hexane (100 torr at 60.4 EF (15.8 EC)), tetramethyldisiloxane (10 torr at 82.9 EF (28.3 EC) 1,3,-dichlorotetra-methyldisiloxane) and combinations thereof that may be evaporated with mild controlled heating. Because these high vapor pressure monomeric gases do not readily cryocondense at ambient or elevated temperatures, deposition rates are low (a few tenths of micrometer/min maximum) relying on radicals chemically bonding to the surface of interest instead of cryocondensation. Remission due to etching of the surface of interest by the plasma competes with reactive deposition. Lower vapor pressure species have not been used in PECVD because heating the higher molecular weight monomers to a temperature sufficient to vaporize them generally causes a reaction prior to vaporization, or metering of the gas becomes difficult to control, either of which is inoperative.

The basic process of flash evaporation is described in U.S. Pat. No. 4,954,371 herein incorporated by reference. This basic process may also be referred to as polymer multi-layer (PML) flash evaporation. Briefly, a radiation polymerizable and/or cross linkable material is supplied at a temperature below a decomposition temperature and polymerization temperature of the material. The material is atomized to droplets having a droplet size ranging from about 1 to about 50 microns. An ultrasonic atomizer is generally used. The droplets are then flash vaporized, under vacuum, by contact with a heated surface above the boiling point of the material, but below the temperature which would cause pyrolysis. The vapor is cryocondensed on a substrate then radiation polymerized or cross linked as a very thin polymer layer.

According to the state of the art of making plasma polymerized films, PECVD and flash evaporation or glow discharge plasma deposition and flash evaporation have not been used in combination. However, plasma treatment of a substrate using glow discharge plasma generator with inorganic compounds has been used in combination with flash evaporation under a low pressure (vacuum) atmosphere as reported in J. D. Affinito, M. E. Gross, C. A. Coronado, and P. M. Martin, A Vacuum Deposition Of Polymer Electrolytes On Flexible Substrates. "Paper for Plenary talk in A Proceedings of the Ninth International Conference on Vacuum Web Coating", November 1995 ed R. Bakish, Bakish Press 1995, pg 20–36., and as shown in FIG. 1*a*. In that system, the plasma generator 100 is used to etch the surface 102 of a moving substrate 104 in preparation to receive the monomeric gaseous output from the flash evaporation 106 that cryocondenses on the etched surface 102 and is then passed by a first curing station (not shown), for example electron beam or ultra-violet radiation, to initiate cross linking and curing. The plasma generator 100 has a housing 108 with a gas inlet 110. The gas may be oxygen, nitrogen, water or an inert gas, for example argon, or combinations thereof. Internally, an electrode 112 that is smooth or having one or more pointed projections 114 produces a glow discharge and makes a plasma with the gas which etches the surface 102. The flash evaporator 106 has a housing 116, with a monomer inlet 118 and an atomizing nozzle 120, for example an ultrasonic atomizer. Flow through the nozzle 120 is atomized into particles or droplets 122 which strike the heated surface 124 whereupon the particles or droplets 122 are flash evaporated into a gas that flows past a series of baffles 126 (optional) to an outlet 128 and cryocondenses on the surface 102. Although other gas flow distribution arrangements have been used, it has been found that the baffles 126 provide adequate gas flow distribution or uniformity while permitting ease of scaling up to large surfaces 102. A curing station (not shown) is located downstream of the flash evaporator 106. The monomer may be an acrylate (FIG. 1*b*). These flash evaporation methods have traditionally been used on smooth surfaces or surfaces lacking microtextured features. A disadvantage of traditional PML (polymer multi-layer) flash evaporation methods is that during the time between condensation of the vapor to a liquid film and the radiation cross linking of the liquid film to a solid layer, the liquid tends to flow preferentially to low points and flatter regions because of gravity and surface tension (FIG. 2*a*) so that the coating surface 150 is geometrically different from the substrate surface 160. Reducing surface temperature can reduce the flow somewhat, but should the monomer freeze, then cross linking is adversely affected. Using higher viscosity monomers is unattractive because of the increased difficulty of degassing, stirring, and dispensing of the monomer.

Many devices have microtextured surfaces, for example quasi-corner reflector type micro-retroreflectors, diffraction gratings, micro light pipes and/or wave guides, and microchannel flow circuits. The devices are presently made by spin coating or physical vapor deposition (PVD). Physical vapor deposition may be either evaporation or sputtering. Spin coating, surface area coverage is limited and scaling up to large surface areas requires multiple parallel units rather than a larger single unit. Moreover, physical vapor deposition processes are susceptible to pin holes.

Therefore, there is a need for an apparatus and method for coating devices that have microtextured surfaces with a conformal coating.

SUMMARY OF THE INVENTION

The present invention is a method of conformally coating a microtextured surface. The method includes plasma polymerization wherein a coating material monomer is cured during plasma polymerization. The method is a combination of flash evaporation with plasma enhanced chemical vapor deposition (PECVD) that provides the unexpected improvements of conformally coating a microtextured substrate at a rate surprisingly faster than standard PECVD deposition rates.

The conformal coating material may be a monomer, or a mixture of monomer with particle materials. The monomer, particle or both may be conjugated, or unconjugated.

The method of the present invention has the steps of (a) flash evaporating a coating monomer forming an evaporate; (b) passing the evaporate to a glow discharge electrode creating a glow discharge monomer plasma from the evaporate; and (c) cryocondensing the glow discharge monomer plasma on a microtextured surface whereupon condensed glow discharge plasma as a liquid begins crosslinking. The crosslinking results from radicals created in the glow discharge plasma and achieves self curing.

It is an object of the present invention to provide a method of conformally coating a microtextured surface.

An advantage of the present invention is that it is insensitive to a direction of motion of the substrate because the deposited monomer layer is self curing. A further advantage is that the conjugation (if any) is preserved during curing. Another advantage of the present invention is that multiple layers of materials may be combined. For example, as recited in U.S. Pat. Nos. 5,547,508 and 5,395,644, 5,260,095, hereby incorporated by reference, multiple polymer layers, alternating layers of polymer and metal, and other layers may be made with the present invention in the vacuum environment.

The subject matter of the present invention is particularly pointed out and distinctly claimed in the concluding portion of this specification. However, both the organization and method of operation, together with further advantages and objects thereof, may best be understood by reference to the following detailed description in combination with the drawings wherein like reference characters refer to like elements.

DESCRIPTION OF THE PREFERRED EMBODIMENT(S)

Figure 1A:
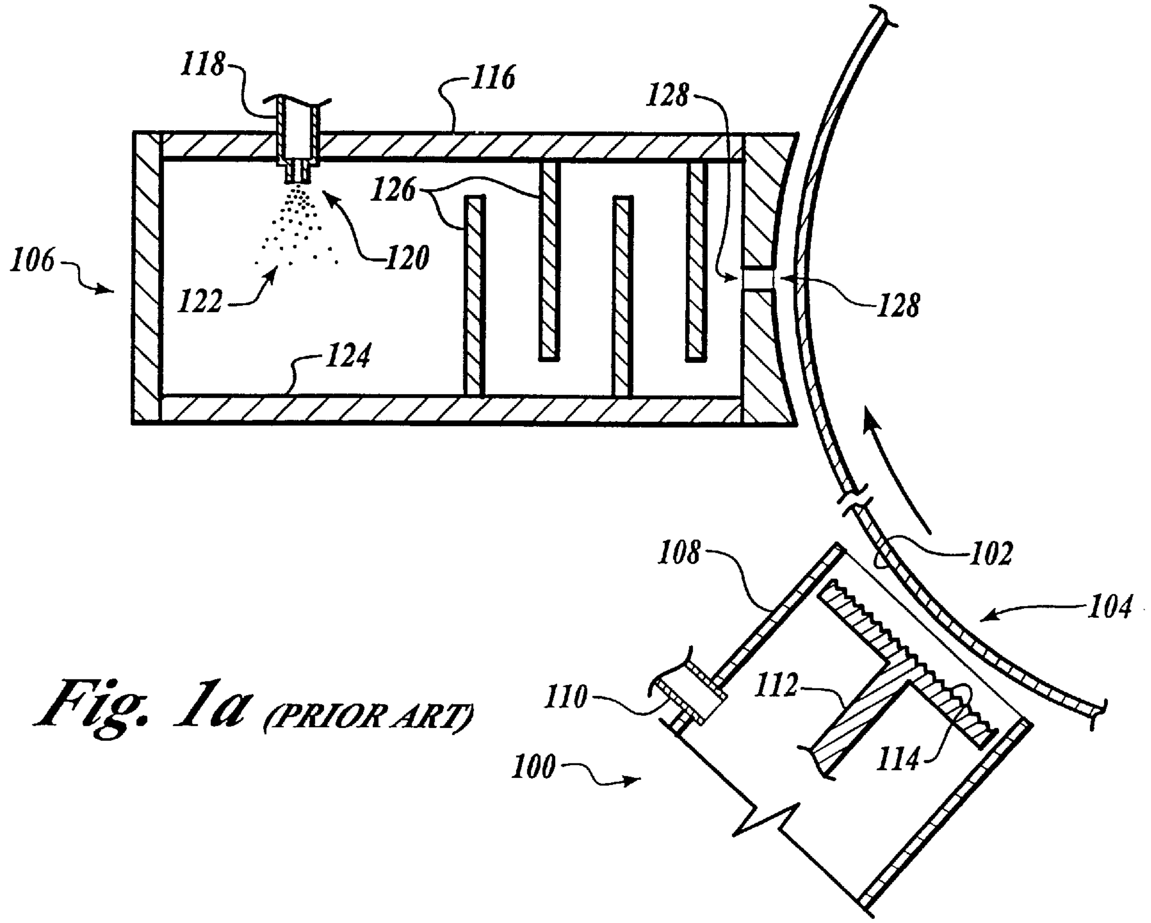
Fig. 1a (PRIOR ART)
FIG. 1*a* is a cross section of a prior art combination of a glow discharge plasma generator with inorganic compounds with flash evaporation.
Figure 1B:
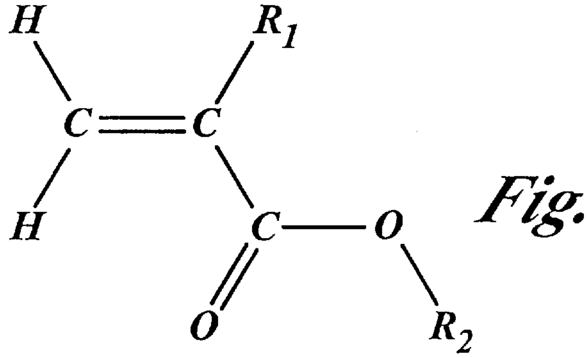
Fig. 1b (PRIOR ART)
FIG. 1*b* is a chemical diagram of a (meth-)acrylate molecule.
Figure 2A:
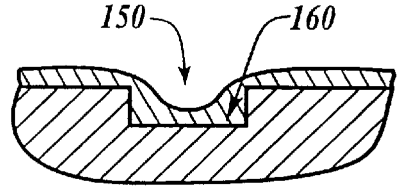
Fig. 2a (PRIOR ART)
FIG. 2*a* is an illustration of a non-conformal coating (prior art).
Figure 2B:
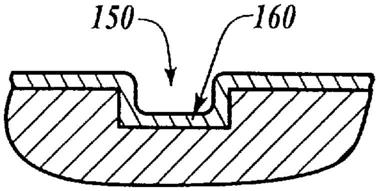
FIG. 2*b* is an illustration of a conformal coating according to the method of the present invention.
Figure 3:
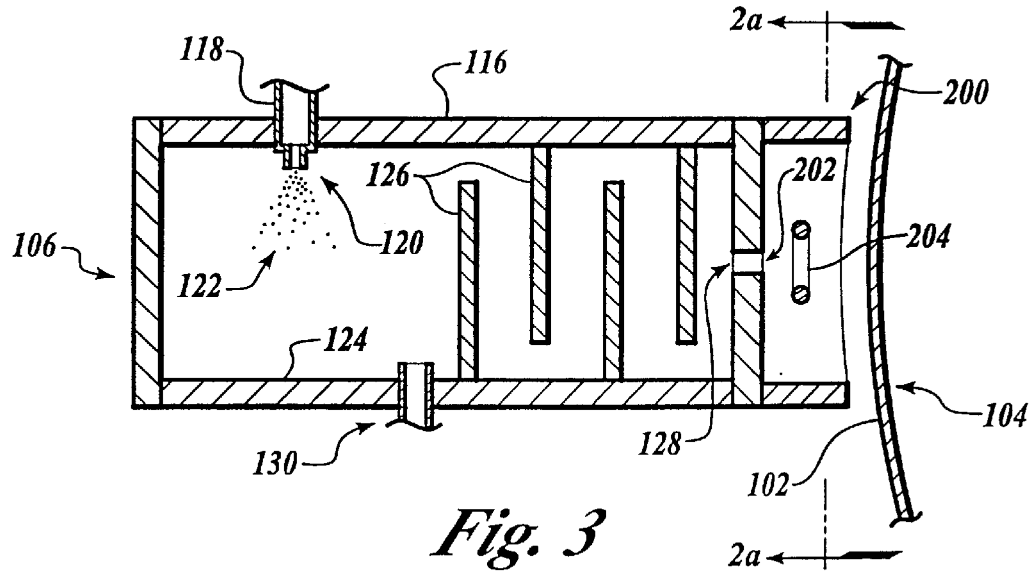
FIG. 3 is a cross section of the apparatus of the present invention of combined flash evaporation and glow discharge plasma deposition.

The present invention is a method of conformally coating a microtextured surface. Microtextured surfaces include but are not limited to quasi-corner reflector type micro-retroreflectors, diffraction gratings, microlight pipes and/or wave guides, microchannel flow circuits and combinations thereof. A conformal coating is illustrated in FIG. 2*b* wherein a coating surface 150 is geometrically similar to the microtextured surface 160. Conformally coating a microtextured surface is done with the apparatus is shown in FIG. 3. The apparatus and method of the present invention are preferably within a low pressure (vacuum) environment or chamber. Pressures preferably range from about $10^{-1}$ torr to $10^{-6}$ torr. The flash evaporator 106 has a housing 116, with a monomer inlet 118 and an atomizing nozzle 120. Flow through the nozzle 120 is atomized into particles or droplets 122 which strike the heated surface 124 whereupon the particles or droplets 122 are flash evaporated into a gas or evaporate that flows past a series of baffles 126 to an evaporate outlet 128 and cryocondenses on the microtextured surface 102. Cryocondensation on the baffles 126 and other internal surfaces is prevented by heating the baffles 126 and other surfaces to a temperature in excess of a cryocondensation temperature or dew point of the evaporate. Although other gas flow distribution arrangements have been used, it has been found that the baffles 126 provide adequate gas flow distribution or uniformity while permitting ease of scaling up to large microtextured surfaces 102. The evaporate outlet 128 directs gas toward a glow discharge electrode 204 creating a glow discharge plasma from the evaporate. In the embodiment shown in FIG. 3, the glow discharge electrode 204 is placed in a glow discharge housing 200 having an evaporate inlet 202 proximate the evaporate outlet 128. In this embodiment, the glow discharge housing 200 and the glow discharge electrode 204 are maintained at a temperature above a dew point of the evaporate. The glow discharge plasma exits the glow discharge housing 200 and cryocondenses on the microtextured surface 102 of the microtextured substrate 104. It is preferred that the microtextured substrate 104 is kept at a temperature below a dew point of the evaporate, preferably ambient temperature or cooled below ambient temperature to enhance the cryocondensation rate. In this embodiment, the microtextured substrate 104 is moving and may be electrically grounded, electrically floating or electrically biased with an impressed voltage to draw charged species from the glow discharge plasma. If the microtextured substrate 104 is electrically biased, it may even replace the electrode 204 and be, itself, the electrode which creates the glow discharge plasma from the monomer gas. Electrically floating means that there is no impressed voltage although a charge may build up due to static electricity or due to interaction with the plasma.

Figure 3A:
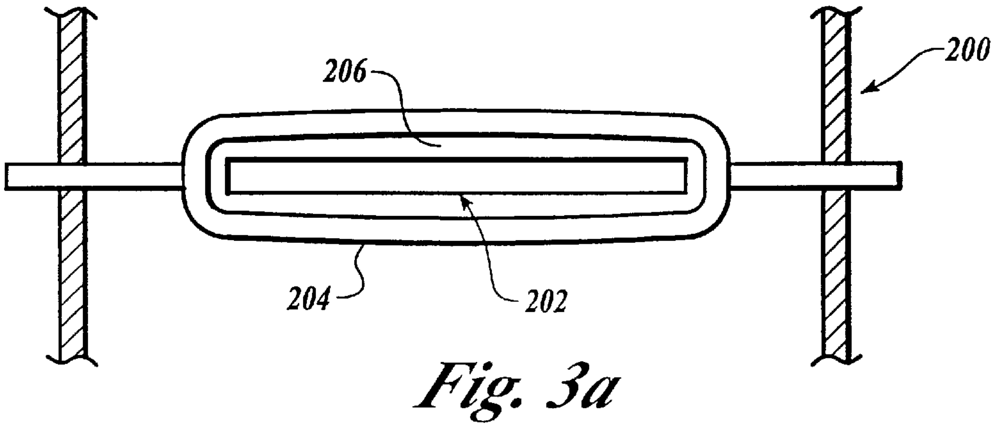
FIG. 3*a* is a cross section end view of the apparatus of the present invention.

A preferred shape of the glow discharge electrode 204, is shown in FIG. 3*a*. In this preferred embodiment, the glow discharge electrode 204 is separate from the microtextured substrate 104 and shaped so that evaporate flow from the evaporate inlet 202 substantially flows through an electrode opening 206. Any electrode shape can be used to create the glow discharge, however, the preferred shape of the electrode 204 does not shadow the plasma from the evaporate issuing from the outlet 202 and its symmetry, relative to the monomer exit slit 202 and microtextured substrate 104, provides uniformity of the evaporate vapor flow to the plasma across the width of the substrate while uniformity transverse to the width follows from the substrate motion.

The spacing of the electrode 204 from the microtextured substrate 104 is a gap or distance that permits the plasma to impinge upon the substrate. This distance that the plasma extends from the electrode will depend on the evaporate species, electrode 204/microtextured substrate 104 geometry, electrical voltage and frequency, and pressure in the standard way as described in detail in ELECTRICAL DISCHARGES IN GASSES, F. M. Penning, Gordon and Breach Science Publishers, 1965, and summarized in THIN FILM PROCESSES, J. L. Vossen, W. Kern, editors, Academic Press, 1978, Part II, Chapter II-1, Glow Discharge Sputter Deposition, both hereby incorporated by reference.

Figure 4:
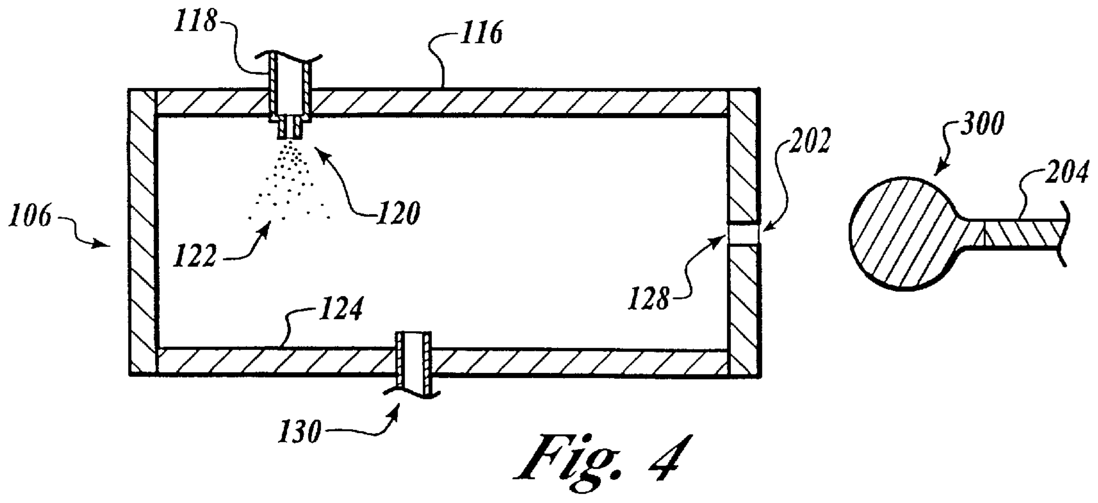
FIG. 4 is a cross section of the present invention wherein the substrate is the electrode.

An apparatus suitable for batch operation is shown in FIG. 4. In this embodiment, the glow discharge electrode 204 is sufficiently proximate a part 300 (microtextured substrate) that the part 300 is an extension of or part of the electrode 204. Moreover, the part is below a dew point to allow cryocondensation of the glow discharge plasma on the part 300 and thereby coat the part 300 with the monomer condensate and self cure into a polymer layer. Sufficiently proximate may be connected to, resting upon, in direct contact with, or separated by a gap or distance that permits the plasma to impinge upon the substrate. This distance that the plasma extends from the electrode will depend on the evaporate species, electrode 204/microtextured substrate 104 geometry, electrical voltage and frequency, and pressure in the standard way as described in ELECTRICAL DISCHARGES IN GASSES, F. M. Penning, Gordon and Breach Science Publishers, 1965, hereby incorporated by reference. The substrate 300 may be stationary or moving during cryocondensation. Moving includes rotation and translation and may be employed for controlling the thickness and uniformity of the monomer layer cryocondensed thereon. Because the cryocondensation occurs rapidly, within milli-seconds to seconds, the part may be removed after coating and before it exceeds a coating temperature limit.

In operation, either as a method for plasma enhanced chemical vapor deposition of low vapor pressure materials (coating material) onto a microtextured surface, or as a method for making self-curing polymer layers (especially PML), the method of the invention has the steps of (a) flash evaporating a coating material monomer forming an evaporate; (b) passing the evaporate to a glow discharge electrode creating a glow discharge monomer plasma from the evaporate; and (c) cryocondensing the glow discharge monomer plasma on a substrate and crosslinking the glow discharge monomer plasma thereon. The crosslinking results from radicals created in the glow discharge plasma thereby permitting self curing.

The flash evaporating has the steps of flowing a coating material monomer to an inlet, atomizing the material through a nozzle and creating a plurality of monomer droplets of the monomer liquid as a spray. The spray is directed onto a heated evaporation surface whereupon it is evaporated and discharged through an evaporate outlet.

Figure 5A:
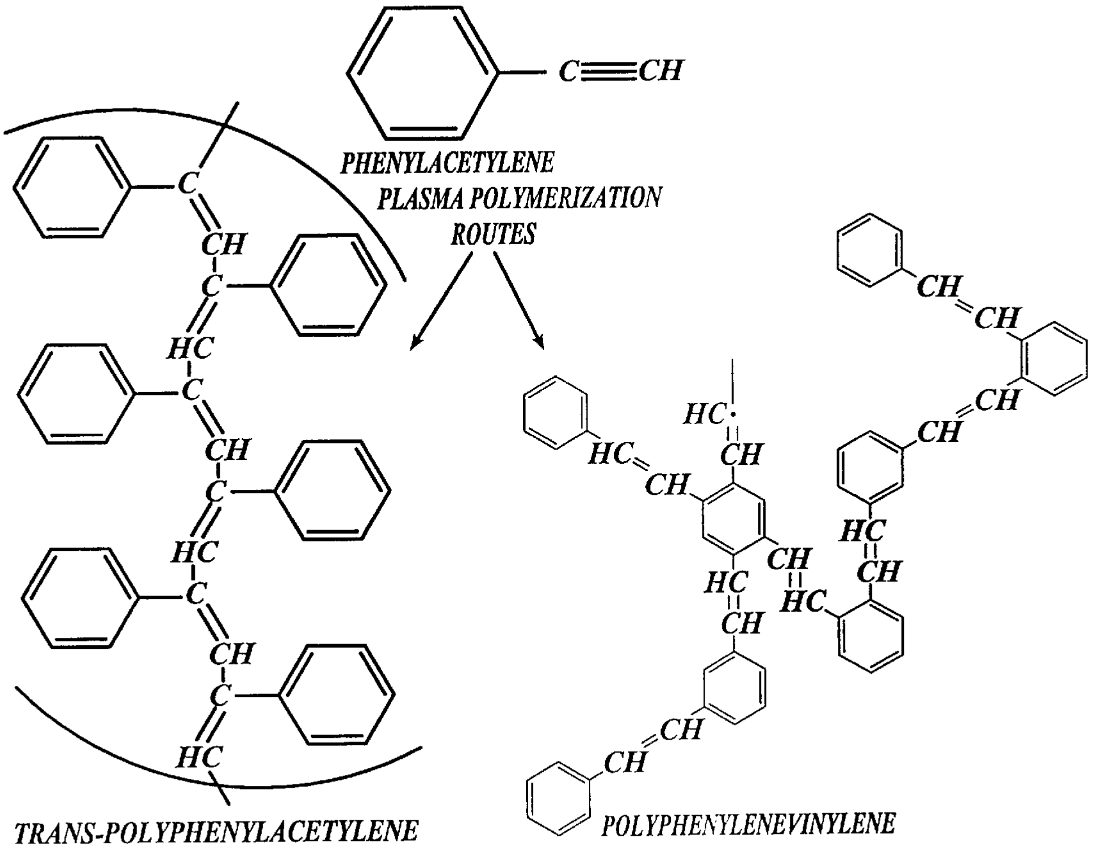
FIG. 5*a* is a chemical diagram including phenylacetylene.

The coating material monomer may be any liquid monomer. However, it is preferred that the liquid monomer has a low vapor pressure at ambient temperatures so that it will readily cryocondense. Preferably, the vapor pressure of the liquid monomer is less than about 10 torr at 83° F. (28.3° C.), more preferably less than about 1 torr at 83° F. (28.3° C.), and most preferably less than about 10 millitorr at 83° F. (28.3° C.). Liquid monomer includes but is not limited to phenylacetylene (FIG. 5*a*), (meth)acrylate and combinations thereof.

Figure 5B:
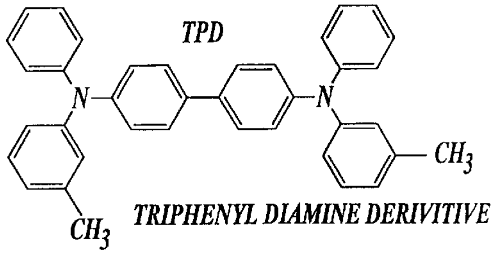
FIG. 5*b* is a chemical diagram of triphenyl diamine derivitive.
Figure 5C:
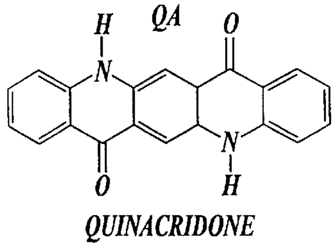
FIG. 5*c* is a chemical diagram of quinacridone.

Further, the liquid monomer may contain particles as a liquid/solid suspension. The particle(s) may be any insoluble or partially insoluble particle type having a boiling point below a temperature of the heated surface in the flash evaporation process. Insoluble particle includes but is not limited to triphenyl diamine derivitive (TPD, FIG. 5*b*), quinacridone (QA, FIG. 5*c*) and combinations thereof.

The insoluble particles are preferably of a volume much less than about 5000 cubic micrometers (diameter about 21 micrometers) or equal thereto, preferably less than or equal to about 4 cubic micrometers (diameter about 2 micrometers). In a preferred embodiment, the insoluble particles are sufficiently small with respect to particle density and liquid monomer density and viscosity that the settling rate of the particles within the liquid monomer is several times greater than the amount of time to transport a portion of the particle liquid monomer mixture from a reservoir to the atomization nozzle. It is to be noted that it may be necessary to stir the particle liquid monomer mixture in the reservoir to maintain suspension of the particles and avoid settling.

The mixture of monomer and insoluble or partially soluble particles may be considered a slurry, suspension or emulsion, and the particles may be solid or liquid. The mixture may be obtained by several methods. One method is to mix insoluble particles of a specified size into the monomer. The insoluble particles of a solid of a specified size may be obtained by direct purchase or by making them by one of any standard techniques, including but not limited to milling from large particles, precipitation from solution, melting/spraying under controlled atmospheres, rapid thermal decomposition of precursors from solution as described in U.S. Pat. No. 5,652,192 hereby incorporated by reference. The steps of U.S. Pat. No. 5,652,192 are making a solution of a soluble precursor in a solvent and flowing the solution through a reaction vessel, pressurizing and heating the flowing solution and forming substantially insoluble particles, then quenching the heated flowing solution and arresting growth of the particles. Alternatively, larger sizes of solid material may be mixed into liquid monomer then agitated, for example ultrasonically, to break the solid material into particles of sufficient size.

Liquid particles may be obtained by mixing an immiscible liquid with the monomer liquid and agitating by ultrasonic or mechanical mixing to produce liquid particles within the liquid monomer. Immiscible liquids include, for example phenylacetylene.

Upon spraying, the droplets may be particles alone, particles surrounded by liquid monomer, and liquid monomer alone. Since both the liquid monomer and the particles are evaporated, it is of no consequence either way. It is, however, important that the droplets be sufficiently small that they are completely vaporized. Accordingly, in a preferred embodiment, the droplet size may range from about 1 micrometer to about 50 micrometers.

By using flash evaporation, the coating material monomer is vaporized so quickly that reactions that generally occur from heating a liquid material to an evaporation temperature simply do not occur. Further, control of the rate of evaporate delivery is strictly controlled by the rate of material delivery to the inlet 118 of the flash evaporator 106.

In addition to the evaporate from the material, additional gases may be added within the flash evaporator 106 through a gas inlet 130 upstream of the evaporate outlet 128, preferably between the heated surface 124 and the first baffle 126 nearest the heated surface 124. Additional gases may be organic or inorganic for purposes included but not limited to ballast, reaction and combinations thereof. Ballast refers to providing sufficient molecules to keep the plasma lit in circumstances of low evaporate flow rate. Reaction refers to chemical reaction to form a compound different from the evaporate. Additional gases include but are not limited to group VIII of the periodic table, hydrogen, oxygen, nitrogen, chlorine, bromine, polyatomic gases including for example carbon dioxide, carbon monoxide, water vapor, and combinations thereof.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method of conformally coating a microtextured surface, comprising the steps of:

(a) making an evaporate by receiving a coating material monomer into a flash evaporation housing, evaporating said coating material monomer on an evaporation surface, and discharging said evaporate through an evaporate outlet;

(b) making a monomer plasma from said evaporate by passing said evaporate proximate a glow discharge electrode and creating a glow discharge for making said plasma from said evaporate; and (c) cryocondensing said monomer plasma as a condensate onto said microtextured surface and polymerizing said condensate before said condensate flows thereby conformally coating said microtextured surface.

2. The method as recited in claim 1, wherein said microtextured surface is proximate the glow discharge electrode, is electrically biased with an impressed voltage, and receives said monomer plasma cryocondensing thereon.

3. The method as recited in claim 1, wherein said glow discharge electrode is positioned within a glow discharge housing having an evaporate inlet proximate the evaporate outlet, said glow discharge housing and said glow discharge electrode maintained at a temperature above a dew point of said evaporate, said microtextured surface is downstream of said monomer plasma, electrically floating, and receives said monomer plasma cryocondensing thereon.

4. The method as recited in claim 1, wherein said microtextured surface is proximate said glow discharge electrode, is electrically grounded, and receives said monomer plasma cryocondensing thereon.

5. The method as recited in claim 1, wherein said coating material is selected from the group of (meth)acrylate, alkene, alkyne, phenylacetylene and combinations thereof.

6. The method as recited in claim 1, wherein said microtextured surface is cooled.

7. The method as recited in claim 1, further comprising adding an additional gas.

8. The method as recited in claim 7, wherein said additional gas is a ballast gas.

9. The method as recited in claim 7, wherein said additional gas is a reaction gas.

10. A method for conformally coating a microtextured surface in a vacuum chamber, comprising the steps of:

(a) flash evaporating a coating material monomer forming an evaporate;

(b) passing said evaporate to a glow discharge electrode creating a glow discharge monomer plasma from said evaporate; and (c) cryocondensing said glow discharge monomer plasma as a condensate on said microtextured surface and crosslinking said glow discharge monomer plasma thereon, said crosslinking resulting from radicals created in said glow discharge monomer plasma for self curing, said crosslinking occurring before said condensate flows thereby conformally coating said microtextured surface.

11. The method as recited in claim 10, wherein said microtextured surface is proximate the glow discharge electrode, is electrically biased with an impressed voltage, and receives said glow discharge monomer plasma cryocondensing thereon.

12. The method as recited in claim 10, wherein said glow discharge electrode is positioned within a glow discharge housing having an evaporate inlet proximate the evaporate outlet, said glow discharge housing and said glow discharge electrode maintained at a temperature above a dew point of said evaporate, said microtextured surface is downstream of said glow discharge monomer plasma, is electrically floating, and receives said glow discharge monomer plasma cryocondensing thereon.

13. The method as recited in claim 10, wherein said microtextured surface is proximate said glow discharge electrode, is electrically grounded, and receives said glow discharge monomer plasma cryocondensing thereon.

14. The method as recited in claim 10, wherein said coating material monomer is phenylacetylene.

15. The method as recited in claim 10, wherein said microtextured surface is cooled.

* * * * *